United States Patent
Ammar et al.

(10) Patent No.: US 6,625,881 B2
(45) Date of Patent: Sep. 30, 2003

(54) SOLDERLESS METHOD FOR TRANSFERRING HIGH FREQUENCY, RADIO FREQUENCY SIGNALS BETWEEN PRINTED CIRCUIT BOARDS

(75) Inventors: Danny F. Ammar, Windermere, FL (US); Gavin Clark, Tavares, FL (US); Eugene Fischer, Clermont, FL (US)

(73) Assignee: Xytrans, Inc., Orlando, FL (US)

( * ) Notice: Subject to any disclaimer, the term of this patent is extended or adjusted under 35 U.S.C. 154(b) by 0 days.

(21) Appl. No.: 10/224,622

(22) Filed: Aug. 20, 2002

(65) Prior Publication Data

US 2003/0049950 A1 Mar. 13, 2003

Related U.S. Application Data

(60) Provisional application No. 60/318,732, filed on Sep. 11, 2001.

(51) Int. Cl.[7] .................................................. H05K 3/36
(52) U.S. Cl. ..................... 29/830; 29/832; 174/35 R; 174/356 GC; 439/79; 439/188
(58) Field of Search ..................... 439/79, 188; 29/830, 29/832; 174/35 GC, 35 R; 361/800

(56) References Cited

U.S. PATENT DOCUMENTS

| | | | |
|---|---|---|---|
| 4,867,696 A | | 9/1989 | Demler, Jr. et al. ......... 439/212 |
| 4,890,199 A | * | 12/1989 | Bentler |
| 5,053,926 A | * | 10/1991 | Dickie |
| 5,129,832 A | | 7/1992 | Marsh et al. ................. 439/79 |
| 5,188,534 A | | 2/1993 | Bertho et al. ................. 439/79 |
| 5,239,127 A | * | 8/1993 | Swikle et al. |
| 5,366,380 A | | 11/1994 | Reymond ..................... 439/66 |
| 5,373,101 A | * | 12/1994 | Barabolak |
| 5,595,490 A | | 1/1997 | Cohen et al. .................. 439/74 |
| 5,617,866 A | | 4/1997 | Marian, Jr. .............. 128/662.3 |
| 5,639,263 A | | 6/1997 | Zell et al. .................... 439/608 |
| 5,641,314 A | | 6/1997 | Broschard, III et al. ..... 439/751 |
| 5,748,455 A | * | 5/1998 | Phillips et al. |
| 5,820,549 A | | 10/1998 | Marian, Jr. ................. 600/437 |
| 5,896,107 A | * | 4/1999 | Huynh |
| 5,967,800 A | | 10/1999 | Bishop ........................ 439/74 |
| 5,991,165 A | | 11/1999 | Jones, Jr. et al. ........... 361/816 |
| 6,025,806 A | | 2/2000 | Deininger et al. .......... 343/713 |
| 6,142,802 A | | 11/2000 | Berg et al. .................. 439/180 |
| 6,200,171 B1 | | 3/2001 | Fusselman et al. ......... 439/736 |

FOREIGN PATENT DOCUMENTS

| | | | | |
|---|---|---|---|---|
| WO | WO 96/21956 | | 7/1996 | ............ H01R/9/09 |

* cited by examiner

*Primary Examiner*—Carl J. Arbes
(74) *Attorney, Agent, or Firm*—Allen, Dyer, Doppelt, Milbrath & Gilchrist, P.A.

(57) ABSTRACT

A connector system and method for cooperating printed circuit boards includes a housing member having a clip receiving slot and circuit board engaging surface that is positioned against a first printed circuit board. At least one electrically conductive clip member has opposing ends and is received within the clip receiving slot. One end is readily secured by soldering to a circuit on the first printed circuit board and the other end is biased into connection with the circuit of a second printed circuit board such that high frequency radio frequency signals are transferred from one printed circuit board to the other printed circuit board via the clip member.

20 Claims, 2 Drawing Sheets

SOLDERLESS METHOD FOR TRANSFERRING HIGH FREQUENCY, RADIO FREQUENCY SIGNALS BETWEEN PRINTED CIRCUIT BOARDS

RELATED APPLICATION

This application is based upon prior filed copending provisional application Ser. No. 60/318,732 filed Sep. 11, 2001.

FIELD OF THE INVENTION

This invention relates to the field of connectors for printed circuit boards and similar applications, and more particularly, this invention relates to the transfer of high frequency, radio frequency signals between cooperating printed circuit boards.

BACKGROUND OF THE INVENTION

Traditionally, high frequency radio frequency signals greater than about 500 MHz require subminiature coaxial connectors (SMA) that work in conjunction with connected coaxial cables for transferring signals between printed circuit boards or other components. Although these subminiature coaxial connectors are semi-precision, subminiature devices used with coaxial cables, including flexible and semi-rigid cabling, the types of connections required to make high frequency signal transfer adequate are relatively large and expensive.

Subminiature coaxial connectors operate at broadband frequencies and have low reflections. Many are designed to have a constant 50 Ohm impedance, making them advantageous for use in various applications in the microwave industry. Many different types of SMA connectors are available, but these connectors are large and expensive to use in some designs.

Some surface mount, pressure contact connectors have been designed for use in traditional DC signal connections, but usually never for transferring high frequency radio frequency signals (up to 4 GHz or more). Although some connectors have been used for transferring one of either DC signals or high frequency signals, such as disclosed in U.S. Pat. No. 5,188,534; 5,129,832; 5,595,490; and 5,991,165, adequate connection methods have not been known that allow the mixing of high frequency and DC signals on the same surface mount contact connector without impacting performance. It is also desirable if high frequency signals could be transferred with a solderless connection through a low cost, surface mount, spring or similar contact, while also allowing transfer of some DC signals. Additionally, many prior art connectors require solder connections at both ends, making assembly of the circuit boards and other component assemblies more difficult.

SUMMARY OF THE INVENTION

It is therefore an object of the present invention to provide a surface mount, pressure contact connector system that allows mixing of high frequency and DC signals without impacting performance.

It is another object of the present invention to provide a connector system between cooperating circuit boards that allows high frequency signals to be transferred with a solderless connection through a low cost, surface mount, spring or similar contact.

The present invention provides a connection method for connecting a pair of cooperating printed circuit boards and allowing high frequency, radio frequency signal transfer in a solderless connection to a second printed circuit board. It also permits DC signal transfer.

In accordance with the present invention, a housing member has a clip receiving slot and a circuit board engaging surface that is positioned against a first printed circuit board. At least one electrically conductive clip member that acts as a spring-like pin has opposing ends and is received within the clip receiving slot. One end of the clip member is readily secured by soldering to a circuit on the first printed circuit board. Another end of the clip member is biased into connection with a circuit of a second printed circuit board such that high frequency radio frequency signals are transferred from one printed circuit board to the other printed circuit board via the clip member.

In yet another aspect of the present invention, the connector system includes a plurality of housing members positioned adjacent to each other such that respective electrically conductive clip members are received within the housing members and positioned for interconnecting radio frequency signal lines, ground lines and DC signal lines that are formed on first and second printed circuit boards.

In yet another aspect of the present invention, the housing member is formed from plastic and is substantially rectangular configured. It includes a flat circuit board engaging surface that rests against the first circuit board. The electrically conductive clip member is substantially v-shaped and has a first leg member and an end that engages a circuit or trace on the first circuit board member. A second leg member includes an end that is spring biased against a circuit or trace on the second circuit board member. The end of the second leg member includes a bent contact forming a radius (concave) surface to aid in engaging a circuit on the second board member. The housing member includes a shoulder formed within each clip receiving slot that engages the second leg member to maintain a biasing force not only against the shoulder, but against the second circuit board to which it engages.

In yet another aspect of the present invention, a plurality of electrically conductive clip members that act as spring-like pins have opposing ends and are received within respective clip receiving slots. One end is readily secured by soldering to the circuit on the first printed circuit board and the other end is biased in connection with a circuit of a second printed circuit board. A clip member interconnects a radio frequency signal line and adjacent clip members interconnect ground lines and DC signal lines for transferring high frequency signals, ground connections and DC signals from one printed circuit board to the other printed circuit board via the clip members.

A method is also disclosed for connecting a pair of cooperating printed circuit boards and comprises the step of soldering to a circuit of a first printed circuit board an end of at least one electrically conductive clip member that is received within a clip receiving slot of a housing member having a circuit board engaging surface that rests against the first printed circuit board. The other end of the electrically conductive clip member is biased against the circuit of the second printed circuit board.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention advantageously uses a connection method which, in one aspect of the present invention, is a surface mount, pressure contact connector that transfers high frequency, radio frequency signals (up to 4 GHz or more) with very low losses. It also allows the mixing of high frequency and DC signals on the same surface mount, pressure contact connector without impacting performance. High frequency signals can be transferred with a solderless connection through a low cost, surface mount spring-type contact of the present invention.

Figure 1:
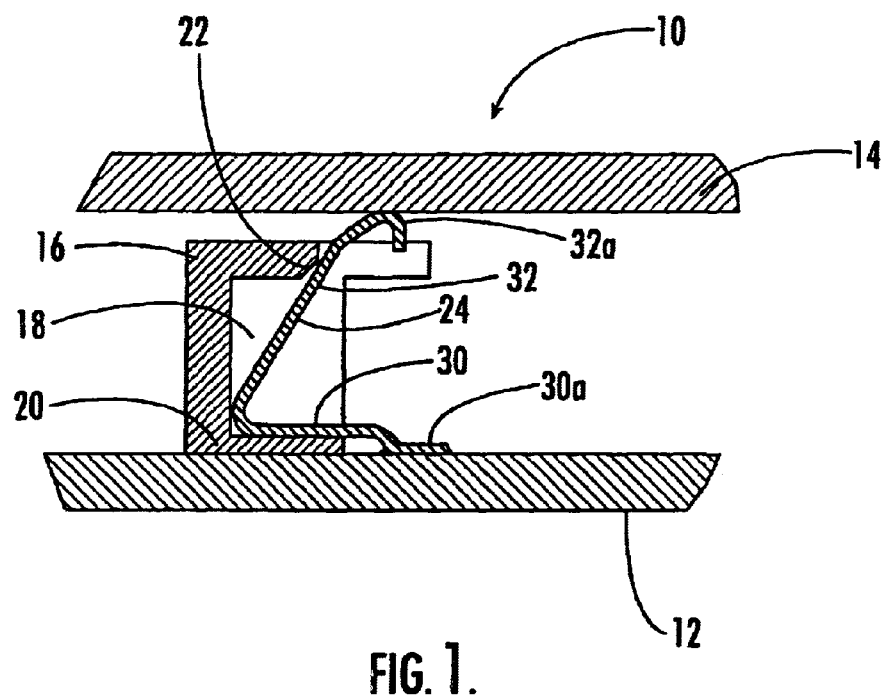
FIG. 1 is a fragmentary, sectional view of a surface mount, pressure contact connector of the present invention and showing a connection between a first and second printed circuit board.

FIG. 1 illustrates a portion of a surface mount, pressure contact connector 10 of the present invention that allows solderless connection between circuit boards. Some prior art connectors that act as spring-type pin or chip contacts have been used at low cost in the industry to transfer DC signals between stacked layers of printed circuit boards (PCB). For example, one type of DC connector has been used in cellular telephones. The present invention goes beyond DC signal transfer, and is an improvement over standard DC connectors because it allows high frequency, radio frequency signals to be transferred with a surface mount, pressure contact application.

Figure 2:
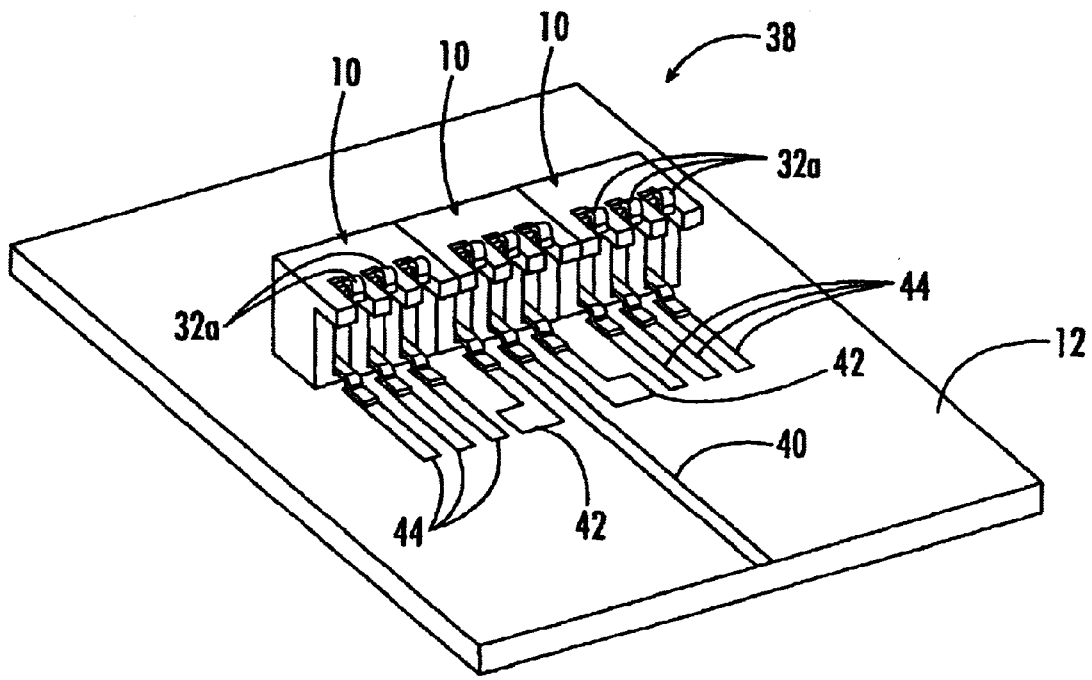
FIG. 2 is an isometric view illustrating a number of connectors positioned adjacent to each other on a first printed circuit board for forming a connection system of the present invention, where high frequency radio frequency signals, ground and DC signals are transferred between overlying, cooperating circuit boards.

As shown in the fragmentary, partial sectional view of FIG. 1, the connector 10 connects a pair of cooperating first and second printed circuit boards 12, 14, i.e., a first and second printed circuit board. The connector 10 includes a housing member 16 having a clip receiving slot 18 (also referred to as a pin receiving slot) and a circuit board engaging surface 20 that is positioned against the first printed circuit board 12. In one aspect of the present invention, each housing member 16 includes three clip receiving slots 18 as illustrated in FIG. 2, where three housing members 16 are shown adjacent to each other. The housing member 16 is preferably formed from plastic and is substantially rectangular configured and includes a substantially flat, circuit board engaging surface that rests prone against the flat surface of the printed circuit board. Each clip receiving slot 18 is formed as a rectangular cut-out and includes a shoulder 22 for engaging the electrically conductive clip members 24 as shown in FIG. 1.

Each clip member 24 is substantially v-shaped as shown in FIG. 1. The clip members 24 are small and can also be referred to as pins because of their small, spring-like and pin-like capacity to make "pin" connections. Each clip member 24 includes a first leg member 30 and end that engages the first printed circuit board 12. This end includes a drop down shoulder 30a that is soldered to a circuit trace or other circuit on the first printed circuit board 12. The upper portion of the first leg member 30 is received within the clip receiving slot 18. A second leg member 32 has an end that is spring biased against the second printed circuit board 14. The second leg member 32 includes a bent contact end 32a that forms what could be referred to as a "pin" or spring contact for engaging in a biased condition a circuit or trace on the second circuit board member. The leg member 32 engages the shoulder 22 in the clip receiving slot to maintain a biasing force or "spring-action" of the clip member against the shoulder, while also maintaining a biasing force against the second printed circuit board such that the pressure contact established by the bent end of the second leg member engages the circuit, trace or other connection point on the second printed circuit board. The second (or first) printed circuit board can have metallized pads that align with the connector "pins" formed by the clip member 24.

In one aspect of the invention where a number of connectors 10 form a connection system 38 as shown in FIG. 2 (the top or second printed circuit board is shown removed), a central clip member interconnects a radio frequency signal line 40 as a preferred 50 ohm impedance radio frequency signal line, known to those skilled in the art. Adjacent clip members 24 (or pins) interconnect ground lines 42 positioned on the opposing side of the radio frequency signal line 40. Although only one ground pin per side shown, the number of ground pins can be varied to increase isolation and improve return loss. Other adjacent clip members 24 (pins) connect DC and signal lines 44. Thus, the connector system 38 using the connectors 10 of the present invention can transfer not only high frequency signals, but also ground connections and DC signals from one printed circuit board 12 to the other printed circuit board 14 via the clip members forming the spring-like pin connections.

In one aspect of the present invention, the spacing between the clip members (or pins) is about 40 mils and DC signals could be carried on other clip members in the same connector.

Figure 3:
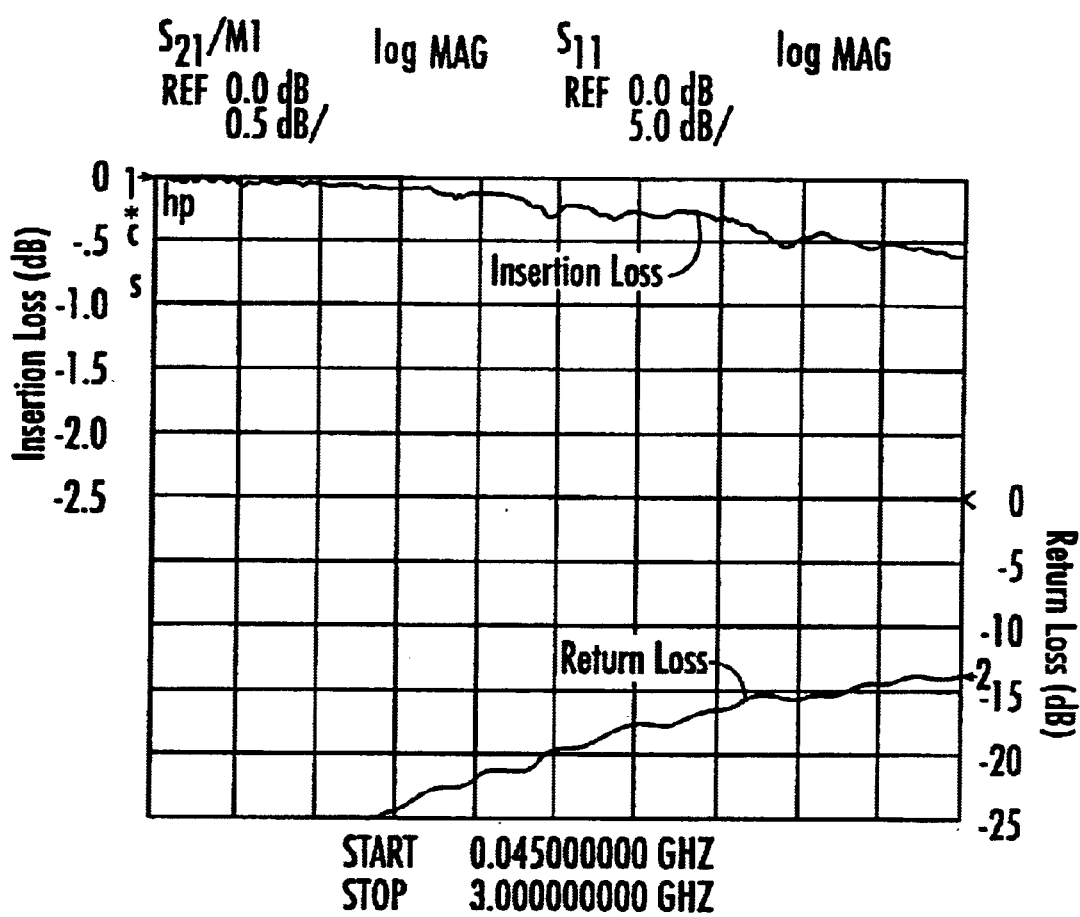
FIG. 3 is a graph showing the measured results for transferring radio frequency signals up to 3 GHz using the connector system shown in FIGS. 1 and 2.

FIG. 3 is a chart illustrating the measured results for transferring radio frequency signals up to 3 GHz using the contact connectors shown in FIG. 2. The insertion loss at 3 GHz is about 0.5 dB and the return loss is approximately −14 dB. Other measurements show that this connector works reliably up to 4 GHz with less than 1 dB insertion loss and less than 10 dB return loss.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A method for connecting a pair of cooperating printed circuit boards comprising:

positioning a housing member having a clip receiving slot and a circuit board engaging surface against a first printed circuit board, wherein at least one electrically conductive clip member having opposing ends is received within the clip receiving slot; and soldering an end of the clip member to a circuit on the first printed circuit board and biasing another end into connection with a circuit of a second printed circuit board such that high frequency radio frequency signals are transferred from one printed circuit board to the other printed circuit board via the clip member.

2. A method according to claim 1, and further comprising the step of positioning a plurality of housing members adjacent to each other such that respective electrically conductive clip members received within said housing members are positioned for interconnecting radio frequency signal line, ground lines, and DC signal lines that are formed on first and second printed circuit boards.

3. A method according to claim 1, and further comprising the step of forming the at least one housing member from plastic.

4. A method according to claim 1, and further comprising the step of forming the at least one housing member as a substantially rectangular configured housing member having a substantially flat circuit board engaging surface.

5. A method according to claim 1, and further comprising the step of forming each electrically conductive clip member as substantially v-shaped having a first leg member and an end that engages the first circuit board member and a second leg member having an end that is spring biased against the second circuit board member.

6. A method according to claim 5, and further comprising the step of forming the end of said second leg member as a bent contact end to aid in engaging a circuit on the second circuit board member.

7. A method according to claim 5, and further comprising the step of forming the housing member as a shoulder within each clip receiving slot that engages the second leg member to maintain a biasing force.

8. A connector system for connecting a pair of cooperating printed circuit boards, including the transfer of DC and high frequency signals comprising:
at least one housing member having a circuit board engaging surface that is positioned against a first printed circuit board and a plurality of substantially parallel clip receiving slots formed therein;
a plurality of electrically conductive clip members having opposing ends and received within respective clip receiving slots and having one end that is readily secured by soldering to a circuit on the first printed circuit board and another end that is biased into connection with a circuit of a second printed circuit board wherein a clip member interconnects a radio frequency signal line and adjacent clip members interconnect ground lines and DC signal lines for transferring high frequency signals, ground connections and DC signals from one printed circuit board to the other printed circuit board via the clip members.

9. A connector system according to claim 8, and further comprising a plurality of housing members positioned adjacent to each other such that respective electrically conductive clip members received within said housing members are positioned for interconnecting the respective radio frequency signal line, ground lines, and DC signal lines.

10. A connector system according to claim 8, wherein said at least one housing member is formed from plastic.

11. A connector system according to claim 8, wherein said at least one housing member comprises a substantially rectangular configured housing member having a substantially flat circuit board engaging surface.

12. A connector system according to claim 8, wherein each electrically conductive clip member is substantially v-shaped having a first leg member and an end that engages the first circuit board member and a second leg member having an end that is spring biased against the second circuit board member.

13. A connector system according to claim 8, wherein said end of said second leg member comprises a bent contact end to aid in engaging a circuit on the second circuit board member.

14. A connector system for connecting a pair of cooperating printed circuit boards, including the transfer of DC and high frequency signals comprising:
at least one housing member having a circuit board engaging surface that is positioned against a first printed circuit board and a plurality of substantially parallel clip receiving slots formed therein, each substantially parallel clip receiving slots including a shoulder;
a plurality of electrically conductive clip members having opposing ends and received within respective clip receiving slots and having one end that is readily secured by soldering to a circuit on the first printed circuit board and another end that engages said shoulder such that said end engaging the shoulder against the shoulder and biased into connection with a circuit of a second printed circuit board wherein a clip member interconnects a radio frequency signal line and adjacent clip members interconnect ground lines and DC signal lines for transferring high frequency signals, ground connections and DC signals from one printed circuit board to the other printed circuit board via the clip members.

15. A connector system according to claim 14, and further comprising a plurality of housing members positioned adjacent to each other such that respective electrically conductive clip members received within said housing members are positioned for interconnecting the respective radio frequency signal line, ground lines, and DC signal lines.

16. A connector system according to claim 14, wherein said at least one housing member is formed from plastic.

17. A connector system according to claim 14, wherein said at least one housing member comprises a substantially rectangular configured housing member having a substantially flat circuit board engaging surface.

18. A connector system according to claim 14, wherein each electrically conductive clip member is substantially v-shaped having a first leg member and an end that engages the first circuit board member and a second leg member and an end that is spring biased against the second circuit board member.

19. A connector system according to claim 18, wherein said end of said second leg member comprises a bent contact end to aid in engaging a circuit on the second circuit board member.

20. A method of connecting a pair of cooperating printed circuit boards comprising the steps of:
soldering to a circuit of a first printed circuit board an end of at least one electrically conductive clip member that is received within a clip receiving slot of a housing member having a circuit board engaging surface that rests against the first printed circuit board; and
biasing the other end of the electrically conductive clip member against a circuit of a second printed circuit board.

* * * * *